(12) United States Patent
Marin et al.

(10) Patent No.: US 11,721,650 B2
(45) Date of Patent: Aug. 8, 2023

(54) METHOD FOR FABRICATING MULTIPLEXED HOLLOW WAVEGUIDES OF VARIABLE TYPE ON A SEMICONDUCTOR PACKAGE

(71) Applicant: Intel Corporation, Santa Clara, CA (US)

(72) Inventors: Brandon C. Marin, Chandler, AZ (US); Aleksandar Aleksov, Chandler, AZ (US); Georgios Dogiamis, Chandler, AZ (US); Jeremy D. Ecton, Gilbert, AZ (US); Suddhasattwa Nad, Chandler, AZ (US); Mohammad Mamunur Rahman, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 908 days.

(21) Appl. No.: 16/437,930

(22) Filed: Jun. 11, 2019

(65) Prior Publication Data

US 2020/0395317 A1 Dec. 17, 2020

(51) Int. Cl.
*H01L 23/66* (2006.01)
*H01L 23/498* (2006.01)
(Continued)

(52) U.S. Cl.
CPC ............ *H01L 23/66* (2013.01); *H01L 21/481* (2013.01); *H01L 21/4846* (2013.01);
(Continued)

(58) Field of Classification Search
CPC ... H01L 23/66; H01L 21/481; H01L 21/4846; H01L 23/49838; H01L 2223/6627;
(Continued)

(56) References Cited

U.S. PATENT DOCUMENTS

| 3,696,433 | A | * | 10/1972 | Killion | H01Q 13/22 333/237 |
| 5,982,250 | A | * | 11/1999 | Hung | H01L 23/66 257/E23.062 |
| 10,396,422 | B1 | * | 8/2019 | Rojas | H01P 1/207 |
| 2009/0237375 | A1 | * | 9/2009 | Khan | G06F 3/0421 385/33 |

(Continued)

*Primary Examiner* — Ahmed N Sefer
(74) *Attorney, Agent, or Firm* — Schwabe, Williamson & Wyatt P.C.

(57) ABSTRACT

Embodiments include semiconductor packages and method of forming the semiconductor packages. A semiconductor package includes first waveguides over a package substrate. The first waveguides include first angled conductive layers, first transmission lines, and first cavities. The semiconductor package also includes a first dielectric over the first waveguides and package substrate, second waveguides over the first dielectric and first waveguides, and a second dielectric over the second waveguides and first dielectric. The second waveguides include second angled conductive layers, second transmission lines, and second cavities. The first angled conductive layers are positioned over the first transmission lines and package substrate having a first pattern of first triangular structures. The second angled conductive layers are positioned over the second transmission lines and first dielectric having a second pattern of second triangular structures, where the second pattern is shaped as a coaxial interconnects enclosed with second triangular structures and portions of first dielectric.

17 Claims, 8 Drawing Sheets

(51) Int. Cl.
  *H01L 21/48* (2006.01)
  *H01P 3/08* (2006.01)
  *H01P 11/00* (2006.01)
  *H01P 3/06* (2006.01)

(52) U.S. Cl.
  CPC ......... *H01L 23/49838* (2013.01); *H01P 3/06* (2013.01); *H01P 3/08* (2013.01); *H01P 3/088* (2013.01); *H01P 11/003* (2013.01); *H01P 11/005* (2013.01); *H01L 2223/6627* (2013.01)

(58) Field of Classification Search
  CPC ... H01L 23/49833; H01L 24/13; H01L 24/16; H01L 24/17; H01L 24/32; H01L 24/81; H01L 24/92; H01L 25/0657; H01P 3/08; H01P 11/003
  See application file for complete search history.

(56) References Cited

U.S. PATENT DOCUMENTS

| | | | |
|---|---|---|---|
| 2012/0013499 A1* | 1/2012 | Hayata | H01L 23/49805 342/112 |
| 2015/0048471 A1* | 2/2015 | Hasch | H01L 23/528 257/664 |
| 2015/0372378 A1* | 12/2015 | Anderson | H01Q 1/50 343/905 |
| 2016/0028164 A1* | 1/2016 | Watanabe | H01Q 21/005 343/771 |
| 2017/0194716 A1* | 7/2017 | Kirino | H01Q 13/06 |
| 2018/0097268 A1* | 4/2018 | Oster | H01P 3/122 |
| 2018/0097269 A1* | 4/2018 | Dogiamis | G06F 1/182 |
| 2019/0190106 A1* | 6/2019 | Kamgaing | H01P 3/121 |
| 2019/0311963 A1* | 10/2019 | Christianson | H01P 3/081 |

* cited by examiner

METHOD FOR FABRICATING MULTIPLEXED HOLLOW WAVEGUIDES OF VARIABLE TYPE ON A SEMICONDUCTOR PACKAGE

FIELD

Embodiments relate to packaging electronic devices. More particularly, the embodiments relate to electronic devices with multiplexed hollow waveguide interconnects in different dielectric layers.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as transmission and signaling interconnects, while optimizing the performance of each device, however is not without issue.

Integration of ICs with optical components, such as transmission interconnects, waveguides interconnects and optical filters, are essential for high-frequency computing. Such interconnects typically have signal loss and crosstalk noise coupling that limit the performance scaling of interconnects in semiconductor devices, particularly in signaling and passive integrations. This problem will continue to become even-more challenging on future semiconductor platforms as system performance scales-down, bus speeds increase, and form factors shrink. For example, in existing technologies, the formation of waveguide interconnects, such as hollow waveguides, have many limitations. These limitations include increased packaging costs, high design complexity, and additional, new manufacturing equipment and capabilities.

Implementing these waveguides involve costly top-down techniques such as e-beam lithography, dry etching, etc., which include disposing such waveguides on silicon and similar materials. Furthermore, in terms of adding photonic devices onto the package, such devices are pre-assembled and then disposed onto the package, all of which are also costly and require new capabilities.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packages (or electronic packages) with hollow waveguides (or waveguide interconnects) and methods of forming such electronic packages. The semiconductor packages described below and methods of forming such semiconductor packages include a package substrate with a plurality of waveguides that are disposed in a plurality of dielectric layers, according to some embodiments. For example, in these embodiments, the semiconductor package may include multiple, hollow core-clad waveguides with angled conductive layers that are disposed within one or more desired layers of the package substrate.

The embodiments described herein provide improvements to existing packaging solutions by maximizing the z-height of the waveguide interconnects and the total number of such waveguide interconnects disposed (or embedded) in a given layer. Also, these embodiments enable implementing (or patterning) different types (and/or amounts) of waveguide interconnects on the same and/or different layers. For example, the semiconductor package may include a fully-enclosed hollow waveguide interconnect and/or a partially-enclosed hollow waveguide interconnect that are/is within a specified dielectric layer of the package substrate. This allows for reduced manufacturing costs, while maximizing layer functionality by integrating multiple, different/same electromagnetic components.

Additionally, implementing multiplexed waveguide interconnects provide improvements to existing packaging solutions by increasing the signaling bandwidth within each layer of the package substrate. These embodiments of the waveguide interconnects may be implemented as multiplexed conductive clad waveguide interconnects with hollow cores (or air cores) that may use air (or the like) as an insulator to allow for low-loss, reduced noise, and low permittivity transmissions (or signals). In these embodiments, implementing angled patterning to form such hollow, triangular waveguide interconnects enables maximizing the waveguide density, while providing a conductive waveguide structure that is substantially robust and may withstand significant compressive forces/stresses generally exerted under a semi-additive process (SAP) or the like (e.g., the lamination process).

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages having package substrates with waveguide interconnects that have angled, patterned conductive layers and hollow air-gap regions.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1:
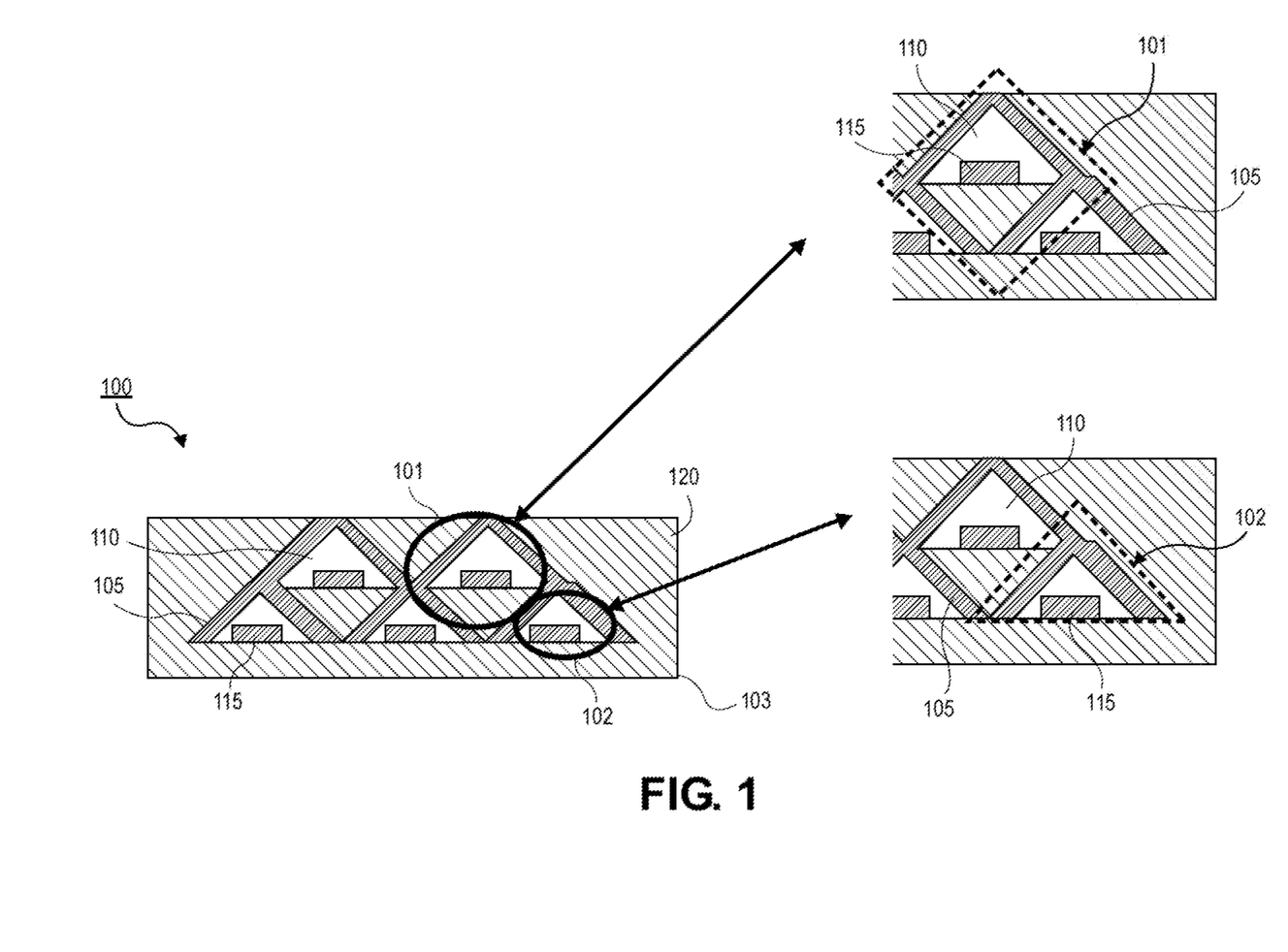
FIG. 1 is an illustration of a cross-sectional view of a package substrate with a plurality of waveguides that are disposed in a plurality of dielectric layers, according to one embodiment.

FIG. 1 is an illustration of a cross-sectional view of a semiconductor package 100 with a package substrate 103 that includes a plurality of waveguide 101-102 (or waveguide interconnects) disposed in a plurality of dielectrics 120, according to one embodiment. In some embodiments, FIG. 1 illustrates one of the approaches that enables implementing (or disposing/forming) a plurality of angled (or triangular) conductive layers 105 in the dielectrics layers 120, and thus surrounding a plurality of transmission lines 115 (or a plurality of conductive lines used as cores) with the angled conductive layers 105 to form the waveguide 101-102 as hollow core-clad waveguide interconnects (or the like) in/within different layers of the dielectrics layers 120 of the package substrate 103. These embodiments of the semiconductor package 100 may implement (or use) angled patterning to form the angled conductive layers 105 that respectively surround (or embed) the transmission lines 115, which are isolated and surrounded by a plurality of cavities 110, such as air-gap that enable low-loss and low permittivity for the respective waveguide 101-102.

Referring now to FIG. 1, a cross-sectional illustration of a semiconductor package 100 with a package substrate 103 is shown, in accordance with an embodiment. In one embodiment, the package substrate 100 may include a plurality of waveguides 101-102 disposed in (or within) a plurality of dielectric layers 120. The waveguides 101-102 may be a plurality of hollow waveguides (or waveguide interconnects) used for transmitting signals in the package substrate 103, where these hollow waveguides may be multiplexed, hollow air-clad waveguides with air as cladding to provide low-loss transmission signals. The waveguides 101-102 may include one or more fully enclosed hollow waveguides 101 and one or more partially enclosed hollow waveguides 102 that are disposed (or embedded) in/within a plurality of dielectric layers 120 of the package substrate 103. Note that, in an alternate embodiment, the package substrate 103 may be implemented as a dielectric layer(s), where the dielectric layer(s) may be the base layer (or the foundational layer) of the semiconductor package 100, as such the waveguides 101-102 may thus be disposed (or formed) over this base layer.

In one embodiment, the waveguides 101-102 may include a plurality of angled conductive layers 105, a plurality of cavities 110, and a plurality of transmission lines 115. These waveguides 101-102 may be used to transmit signals in the package substrate 100. In one embodiment, the transmission lines 115 may be implemented as conductive lines/cores of the waveguide interconnects 101-102. For one embodiment, the transmission lines 115 may be disposed on/over the dielectric layers 120 and approximately positioned (or located) at the center of the waveguides 101-102. The transmission lines 115 may be surrounded by the cavities 110 and the angled conductive layers 105 of the waveguides 101-102. In an embodiment, as shown in FIG. 1, the plurality of angled conductive layers 105 may include a plurality of angled/slanted conductive interconnects that are disposed, positioned, and coupled to form a plurality of triangular structures. In some embodiments, the cavities 110 may be disposed (or filled) with air (or a like insulator) that surrounds and embeds the transmission lines 115. For some embodiments, the transmission lines 115 may include a conductive line, a stripline, a microstrip, a dual-stripline, an embedded-microstrip, and/or the like.

For one embodiment, the package substrate 103 may include, but is not limited to, a package, a substrate, a printed circuit board (PCB), and a motherboard. For one embodiment, the package substrate 103 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers 120, where each dielectric layer can be a photosensitive dielectric layer. For one embodiment, the PCB 103 may include a plurality of conductive layers (e.g., a plurality of transmission lines 115, a plurality of angled conductive layers 105, etc.), which may further include copper (or metallic) traces, lines, pads, vias, via pads, holes, and/or planes.

In some embodiments, the transmission lines 115 and the angled conductive layers 105 may be formed of a conductive material (or a metallic material) such as copper, gold, or the like. For some embodiments, the transmission lines 115 may have a width and a thickness. In some embodiment, the transmission lines 115 may have approximately the same widths and thicknesses. In other embodiments, the transmission lines 115 may have different widths and thicknesses. In an embodiment, the transmission lines 115 may be the rectangle conductors/cores of the respective waveguides 101-102. For some embodiments, the angled conductive layers 105 may have a width and a thickness. In some embodiment, the angled conductive layers 105 may have approximately the same widths and thicknesses. In other embodiments, the angled conductive layers 105 may have different widths and thicknesses. In an embodiment, the angled conductive layers 105 may be the outer triangular conductors of the respective waveguides 101-102.

In one embodiment, the waveguides 101-102 may be disposed (or formed) over/within the dielectric layers 120. Additionally, as shown in FIG. 1, the semiconductor package 100 may include one or more different types of hollow core-clad waveguides such as the waveguides 101 and the waveguides 102. In these embodiments, the waveguides 101 may be implemented (or designed/patterned) as coaxial type waveguides that are fully enclosed with the triangular, angled conductive layers 105 surrounding the respective cavities 110 and the transmission lines 115. Additionally, in these embodiments, the waveguides 102 may be implemented (or designed/patterned) as triangular type waveguides that are partially enclosed with the angled conductive layers 105 surrounding the respective cavities 110 and the transmission lines 115, where such waveguides 102 may include only the top portions of the coaxial type waveguides 101.

Figure 2A:
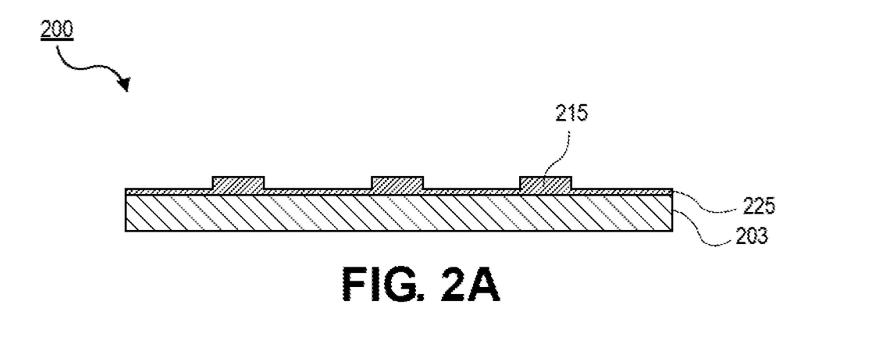
FIGS. 2A-2N are illustrations of cross-sectional views of a process flow to form a package substrate with a plurality of waveguides that are disposed in a plurality of dielectric layers, according to some embodiments.
Figure 2B:
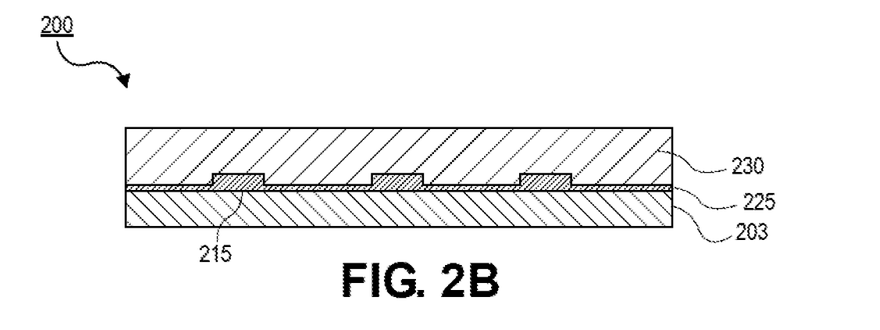
Figure 2C:
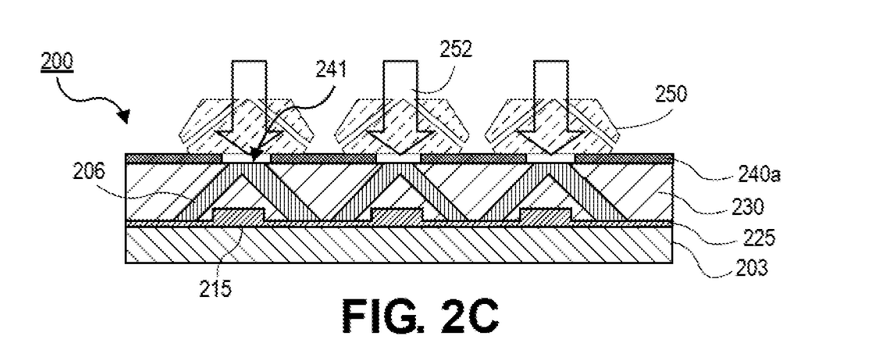
Figure 2D:
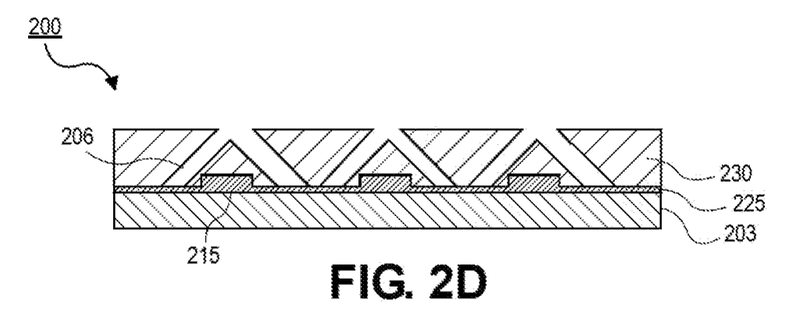
Figure 2E:
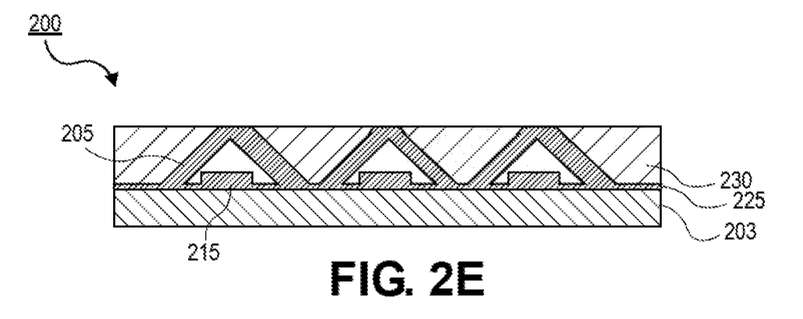
Figure 2F:
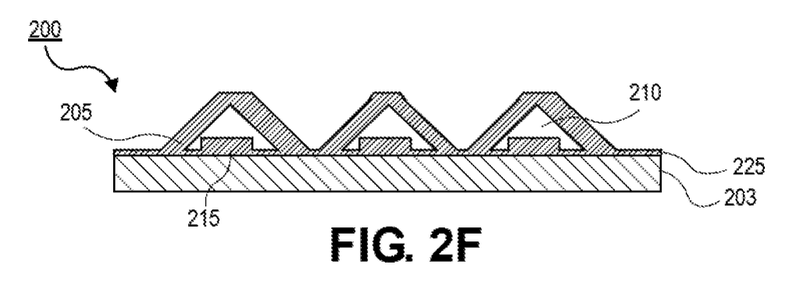
Figure 2G:
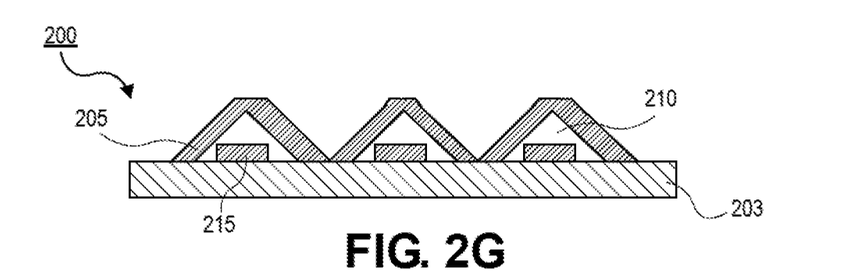
Figure 2H:
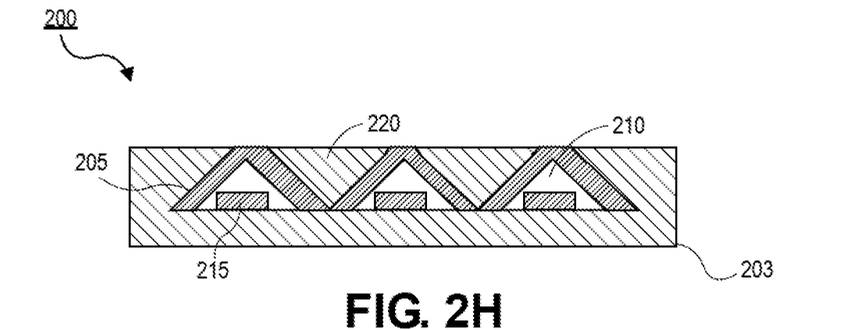
Figure 2I:
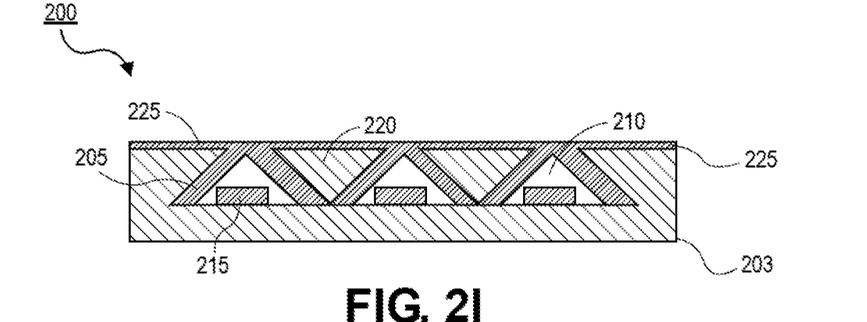
Figure 2J:
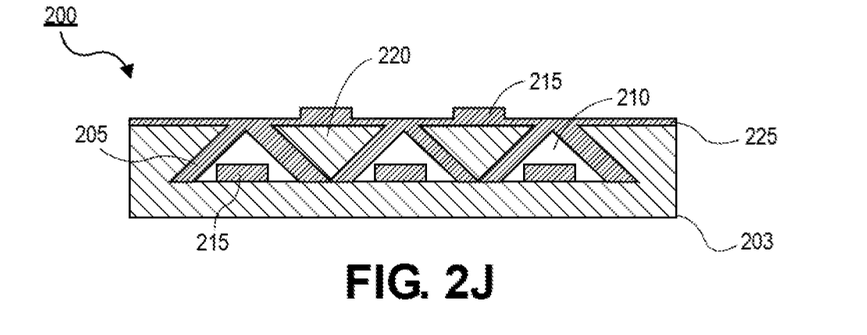

Furthermore, in some embodiments, the transmission lines 115 of the waveguides 102 (or the partially enclosed waveguides) may be disposed directly over a first layer of the dielectric layers 120, while the transmission lines 115 of the waveguides 101 (or the fully enclosed waveguides) may be disposed directly over a second layer of the dielectric layers 120 (e.g., as shown in FIG. 2J). In one embodiment, the angled conductive layers 105 may have a metal conductivity that is the substantially equal to (or the same as) a metal conductivity of the transmission lines 115. In another embodiment, the angled conductive layers 105 may have a metal conductivity that is different than a metal conductivity of the transmission lines 115.

As shown in FIG. 1, the angled conductive layers 105 may be patterned and disposed in the dielectric layers 120 to form the triangular-shaped, hollow waveguides 101-102. In some embodiments, the waveguides 101-102 may be formed with a desired area (or volume), where the desired area is selected to optimize/improve the transmission line loss and crosstalk noise properties. For example, in an embodiment, the transmission lines 115 may have a thickness that is approximately 2 um to 50 um. Furthermore, the transmission lines 115 may have a width that is approximately 2 um to 50 um.

Additionally, in some embodiments, the waveguides 101-102 may have a thickness that is approximately 5 um to 100 um, where such thickness may be defined from the bottom surface to the top surface of the cavities 110. Likewise, in some embodiments, the waveguides 101-102 may have a width that is approximately 15 um to 250 um, where such width may be defined by each triangular structure of the cavities 110 from the one edge of the angled conductive layers 105 (or the left-side of the angled conductive layers as shown in FIG. 1) to another, opposite edge of the angled conductive layers 105 (or the right-side of the angled conductive layers as shown in FIG. 1). In some embodiments, the triangular structures of waveguides 101-102 may have angles that are approximately 30 to 75 degrees.

Note that the semiconductor package 100 may include fewer or additional packaging components based on the desired packaging design.

Figure 2K:
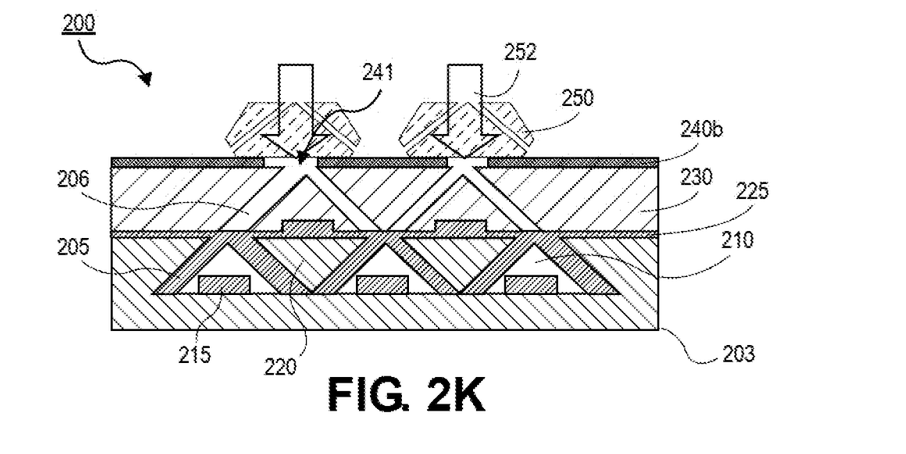
Figure 2L:
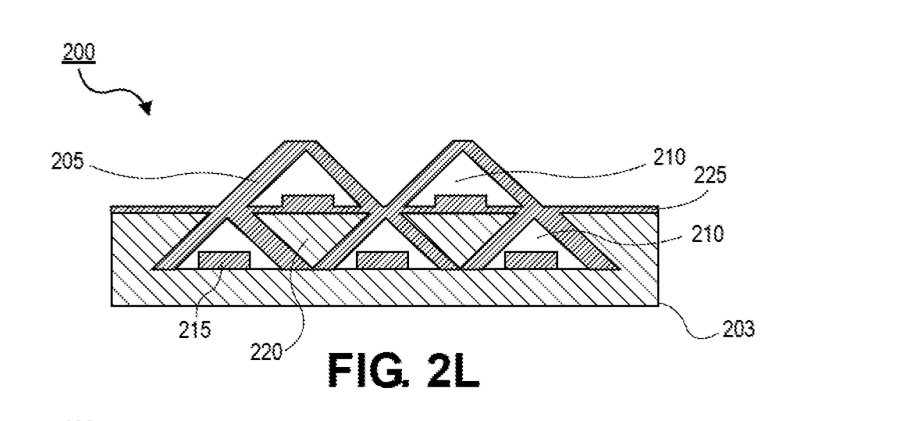
Figure 2M:
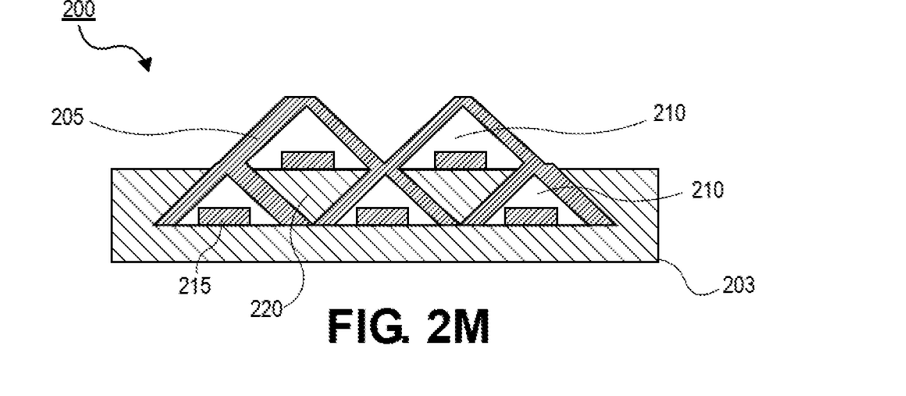
Figure 2N:
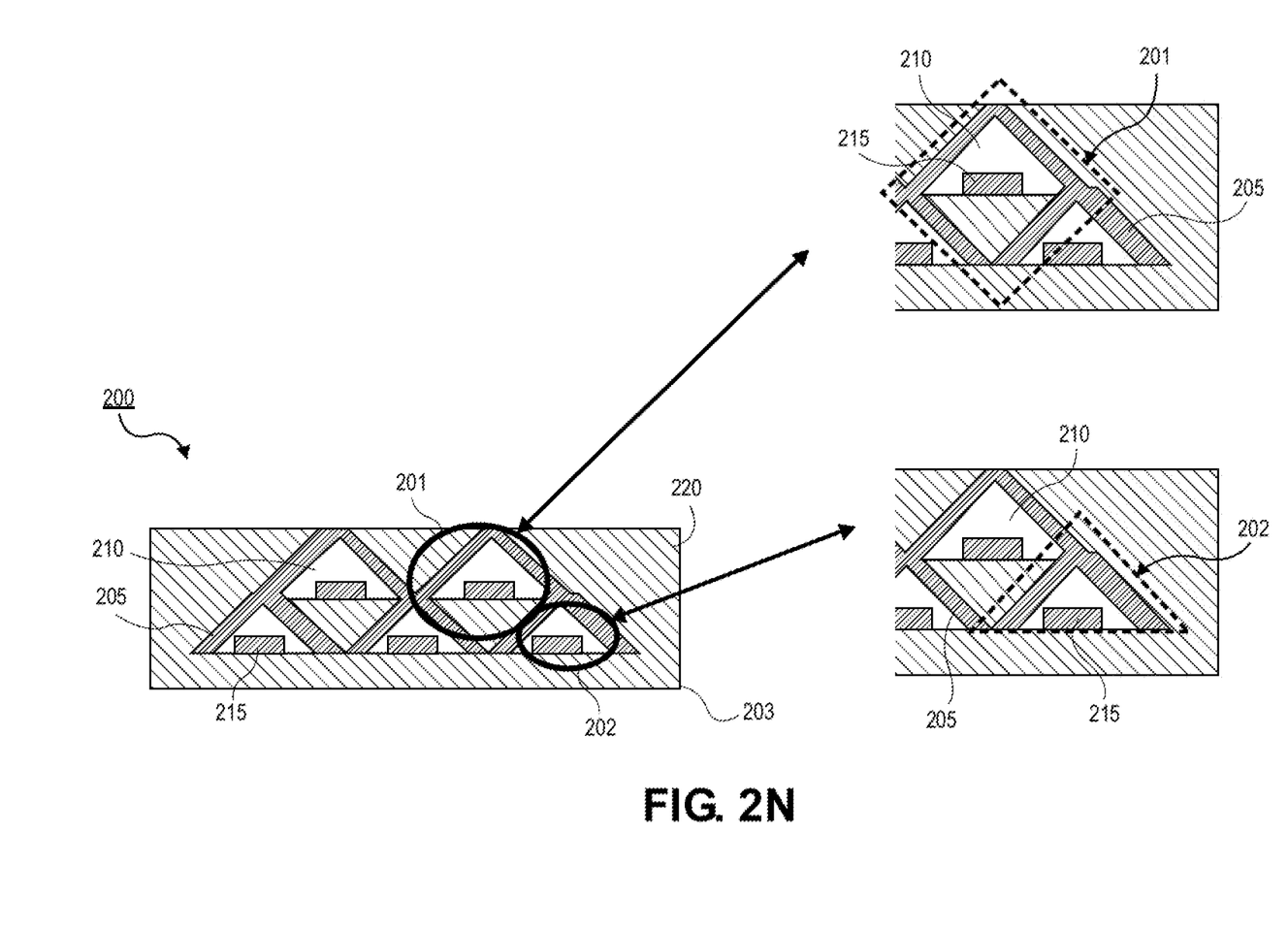

FIGS. 2A-2N are a series of cross-sectional illustrations that depict a semiconductor package 200 with a package substrate 203 that has a plurality of waveguides 201-202 disposed within a plurality of dielectric layers 220, according to some embodiments. The process flow illustrated in FIGS. 2A-2N forms the semiconductor package 200 that may be substantially similar to the semiconductor package 100 described above in FIG. 1. Accordingly, as described above, this process flow of the semiconductor package 200 illustrates one of the approaches that enables patterning and disposing a plurality of angled conductive layers 205 in the dielectric layers 220, and thus surrounding a plurality of transmission lines 215 with the angled conductive layers 205 to form the waveguides 201-202 in different layers of the dielectrics 220 of the package substrate 203, according to some embodiments.

Referring now to FIG. 2A, a cross-sectional illustration of a semiconductor package 200 is shown, in accordance with an embodiment. In an embodiment, the semiconductor package 200 may include a package substrate 203, a seed layer 225, and a plurality of transmission lines 215. The seed layer 225 may be disposed over the package substrate 203. Additionally, the transmission lines 215 (or the first set of transmission lines) may be disposed over the seed layer 225 to define the cores of the first set of waveguides (i.e., the cores of the waveguides 202 as shown below in FIG. 2N). In one embodiment, the seed layer 225 may be formed of a conductive material such as copper or the like, where the seed layer 225 and the transmission lines 215 are formed of the same conductive material. In one embodiment, the package substrate 203 and the transmission lines 215 may be substantially similar to the package substrate 103 and the transmission lines 115 described above in FIG. 1.

Referring now to FIG. 2B, a cross-sectional illustration of a semiconductor package 200 is shown, in accordance with an embodiment. In an embodiment, a resist layer 230 may be disposed over the transmission lines 215 and the seed layer 225. For one embodiment, the resist layer 230 may be a photoresist layer such as a dry-film resist (DFR) layer. Moreover, in these embodiments, the resist layer 230 may be a permanent positive photoresist layer, a positive photoimageable dielectric (PID) layer, or the like. In some embodiments, the resist layer 230 may be implemented to form (or pattern) a plurality of angled conductive layers through the resist layer 230 and over the seed layer 225, as shown below in a subsequent process.

Referring now to FIG. 2C, a cross-sectional illustration of a semiconductor package 200 is shown, in accordance with an embodiment. In an embodiment, a patterned mask 240a may be disposed over the resist layer 230, the seed layer 225, and the transmission lines 215. For one embodiment, the mask 240a may be patterned with openings 241 (or holes) that may expose one or more surfaces (or portions) of the resist layer 230. Furthermore, in some embodiments, a prism 250 may be disposed over the openings 241, the mask 240a, and the resist layer 230 to subsequently pattern a plurality of angled openings 206 (or angled gaps) through the resist layer 230. The prism 250 may be a large glass prism or an array of smaller glass prisms.

In an embodiment, a light source 252 (e.g., a laser direct imaging source, a ultra-violet (UV) light source, etc.) may be exposed over (or through) the prism 250, the mask 240a, and the one or more surfaces of the resist layer 230 to form the angled openings 206 through the resist layer 230. Furthermore, as shown in FIG. 2D, in an embodiment, the angled openings 206 may be patterned to expose one or more surfaces of the seed layer 225, where such angled openings 206 may be patterned to subsequently form a plurality of angled conductive layers as described below in a subsequent processing step.

Referring now to FIG. 2E, a cross-sectional illustration of a semiconductor package 200 is shown, in accordance with an embodiment. In an embodiment, a conductive material (e.g., copper or the like) may be disposed into the angled openings to form a plurality of angled conductive layers 205.

For one embodiment, the angled conductive layers 205 may be implemented by electrolytically plating the conductive material (or copper) over the seed layer 225 (e.g., this plating process may implement the cladding of the respective waveguides).

Referring now to FIG. 2F, a cross-sectional illustration of a semiconductor package 200 is shown, in accordance with an embodiment. In an embodiment, the semiconductor package 200 may include removing (or striping) the resist layer to expose surfaces of the seed layer 225. For one embodiment, after the removal of the resist layer, the angled conductive layers 205 remain patterned/disposed over the seed layer 225 and the transmission lines 215, where such removal of the resist layer also forms a plurality of cavities 210 that are embedded between the angled conductive layers 205 and the transmission lines 215. The resist layer may be removed with an etching process or the like.

Referring now to FIG. 2G, a cross-sectional illustration of a semiconductor package 200 is shown, in accordance with an embodiment. In an embodiment, the semiconductor package 200 may include removing the seed layer to expose surfaces of the package substrate 203. The seed layer may be removed (or etched) with a flash/etching step. As shown in FIG. 2G, after the removal of the resist and seed layers, the remaining structure now includes the triangular structure of the first set of waveguides (e.g., the first set of waveguides are substantially similar to the waveguides 102 described above in FIG. 1).

In one embodiment, the first set of waveguides (i.e., the partially enclosed air-gap waveguides described above) may be comprised of the angled conductive layers 205 that are implemented as triangular structures, and the transmission lines 215 that are implemented as isolated conductive (or metal) cores and surrounded by the angled conductive layers 205. In these embodiments, the cavities 210 may also be implemented as triangular structures with hollow bodies that are defined by the respective triangular structures of the angled conductive layers 205, where these hollow bodies of the cavities 210 may be filled with air to form the air-gaps of the respective waveguides. In alternate embodiments, the cavities 210 may be filled with an insulator material or the like, where such insulator material may have similar transmission properties as air to provide low-loss and low permittivity. Additionally, the angle conductive layers 205 of the first set of waveguides may have top surfaces that are substantially flat and parallel to the top surfaces of the package substrate 203, where the top surfaces of the first set of waveguides may be substantially coplanar to each other.

Referring now to FIG. 2H, a cross-sectional illustration of a semiconductor package 200 is shown, in accordance with an embodiment. In an embodiment, a dielectric layer 220 may be disposed (or laminated) over the angled conductive layers 205 and the package substrate 203. This dielectric layer 220 may be a first dielectric layer that surrounds the first set of waveguides and may be etched (or polished) to have a top surface that is substantially coplanar to the top surfaces of the angled conductive layers 205 of the first set of waveguides. The dielectric layer 220 may include any dielectric material or the like. The dielectric layer(s) 220 may be substantially similar to the dielectric layer(s) 110 described above in FIG. 1.

Referring now to FIG. 2I, a cross-sectional illustration of a semiconductor package 200 is shown, in accordance with an embodiment. In an embodiment, a seed layer 225 may be disposed over the top surfaces of the angled conductive layers 205 and the dielectric layers 220. The seed layer 225 may be a conductive material such as copper or the like. The seed layer 225 may be substantially similar to the seed layer 225 shown in FIG. 2A.

Referring now to FIG. 2J, a cross-sectional illustration of a semiconductor package 200 is shown, in accordance with an embodiment. In one embodiment, the transmission lines 215 (or the second set of transmission lines) may be disposed over the seed layer 225 to define the cores of the second set of waveguides (i.e., the cores of the waveguides 201 as shown below in FIG. 2N). In some embodiments, these transmission lines 215 may be disposed above the dielectric layer(s) 220 and positioned approximately in between (or at the center) the top surfaces of the triangular structures of the angled conductive layers 205 of the first set of waveguides, where the triangular structures of the dielectric layer(s) 220 may be implemented as the bottom portion of the second set of waveguides (i.e., the fully enclosed air-gap waveguides described above) as shown below in a subsequent processing step. In some embodiments, these transmission lines 215 may be implemented with an electroless plating process or the like.

Referring now to FIG. 2K, a cross-sectional illustration of a semiconductor package 200 is shown, in accordance with an embodiment. In the following FIGS. 2K-2N, the semiconductor package 200 may repeat the same processing steps described above in FIG. 2B-2H to implement (or disposed/form) the second set of waveguides.

In an embodiment, a resist layer 230 may be disposed over the transmission lines 215 and the seed layer 225. For one embodiment, the resist layer 230 may be a photoresist layer such as a DFR layer. Moreover, in these embodiments, the resist layer 230 may be a permanent positive photoresist layer, a positive PID layer, or the like. The resist layer 230 may be substantially similar to the resist layer 230 shown in FIG. 2B, however, in alternate embodiments, the resist layers 230 may include different materials if desired. In some embodiments, the resist layer 230 may be implemented to form (or pattern) a plurality of angled conductive layers through the resist layer 230 and over the seed layer 225, as shown below in a subsequent process.

In an embodiment, a patterned mask 240b may be disposed over the resist layer 230, the seed layer 225, and the transmission lines 215. For one embodiment, the mask 240a may be patterned with openings 241 (or holes) that may expose one or more surfaces (or portions) of the resist layer 230. Furthermore, in some embodiments, a prism 250 may be disposed over the openings 241, the mask 240b, and the resist layer 230 to subsequently pattern a plurality of angled openings 206 (or angled gaps) through the resist layer 230. The prism 250 may be a large glass prism or an array of smaller glass prisms. The prism 250 may be substantially similar to the prism 250 shown in FIG. 2C.

In an embodiment, a light source 252 (e.g., a laser direct imaging source, a UV light source, etc.) may be exposed over (or through) the prism 250, the mask 240b, and the one or more surfaces of the resist layer 230 to form the angled openings 206 through the resist layer 230. Furthermore, as shown in FIG. 2K, in an embodiment, the angled openings 206 may be patterned to expose one or more surfaces of the seed layer 225 that is disposed over the top surfaces of the angled conductive layers 205, where such angled openings 206 may be patterned to subsequently form a plurality of angled conductive layers as shown below in a subsequent processing step.

Referring now to FIG. 2L, a cross-sectional illustration of a semiconductor package 200 is shown, in accordance with an embodiment. In an embodiment, a conductive material (e.g., copper or the like) may be disposed into the angled openings to form a plurality of angled conductive layers 205 (or a second set of angled conductive layers) that extend (and are conductive coupled with) the angled conductive layers 205 in the first layer of the dielectric layers 220. For one embodiment, the angled conductive layers 205 may be implemented by electrolytically plating the conductive material over the seed layer 225 (e.g., this plating process may implement the cladding of the respective waveguides).

Furthermore, in an embodiment, the semiconductor package 200 may include removing (or stripping) the resist layer to expose surfaces of the seed layer 225. For one embodiment, after the removal of the resist layer, the angled conductive layers 205 remain patterned/disposed over the seed layer 225, the transmission lines 215, and the dielectric layer(s) 220, where such removal of the resist layer also forms a plurality of cavities 210 that are embedded between the angled conductive layers 205 and the transmission lines 215. The resist layer may be removed with an etching process or the like.

Referring now to FIG. 2M, a cross-sectional illustration of a semiconductor package 200 is shown, in accordance with an embodiment. In an embodiment, the semiconductor package 200 may include removing the seed layer to expose the top surface of the first layer of the dielectric layers 220. The seed layer may be removed (or etched) with a flash/etching step. As shown in FIG. 2M, after the removal of the resist and seed layers, the remaining structure now includes the triangular structure of the second set of waveguides (e.g., the second set of waveguides are substantially similar to the waveguides 101 described above in FIG. 1).

In one embodiment, the second set of waveguides (i.e., the fully enclosed air-gap waveguides described above) may be comprised of the angled conductive layers 205 that are implemented as triangular structures, and the transmission lines 215 that are implemented as isolated conductive (or metal) cores and surrounded by the angled conductive layers 205 and the first layer of the dielectric layers 220. In these embodiments, the cavities 210 may also be implemented as triangular structures with hollow bodies that are defined by the respective triangular structures of the angled conductive layers 205, where these hollow bodies of the cavities 210 may be filled with air to form the air-gaps of the respective waveguides. In alternate embodiments, the cavities 210 may be filled with an insulator material or the like, where such insulator material may have similar transmission properties as air to provide low-loss and low permittivity. Additionally, the angle conductive layers 205 of the second set of waveguides may have top surfaces that are substantially flat and parallel to the top surfaces of the package substrate 203, where the top surfaces of the second set of waveguides may be substantially coplanar to each other. Also note that, as shown in FIG. 2M, after disposing (or stacking) the angled conductive layers 205, the second (or top) set of angled conductive layers 205 may have a slight offset from the first (or bottom) set of angled conductive layers 205.

Referring now to FIG. 2N, a cross-sectional illustration of a semiconductor package 200 is shown, in accordance with an embodiment. In an embodiment, a dielectric layer 220 may be disposed (or laminated) over the angled conductive layers 205 and the package substrate 203 to ultimately form a plurality of waveguides 201-202 that include different multiplex hollow air-gap waveguides that are partially enclosed (as shown with the waveguides 202 formed in the first layer) and/or fully enclosed (as shown with the waveguides 201 formed in the first and second layers). This dielectric layer 220 may be a second dielectric layer that surrounds the second set of waveguides 201 and may be etched (or polished) to have a top surface that is substantially coplanar to the top surfaces of the angled conductive layers 205 of the second set of waveguides 201. The dielectric layer 220 may include any dielectric material or the like. The dielectric layers 220 may be substantially similar to the dielectric layers 110 described above in FIG. 1.

Note that the semiconductor package 200 as shown with FIGS. 2A-2N may include fewer or additional packaging components based on the desired packaging design.

Figure 3:
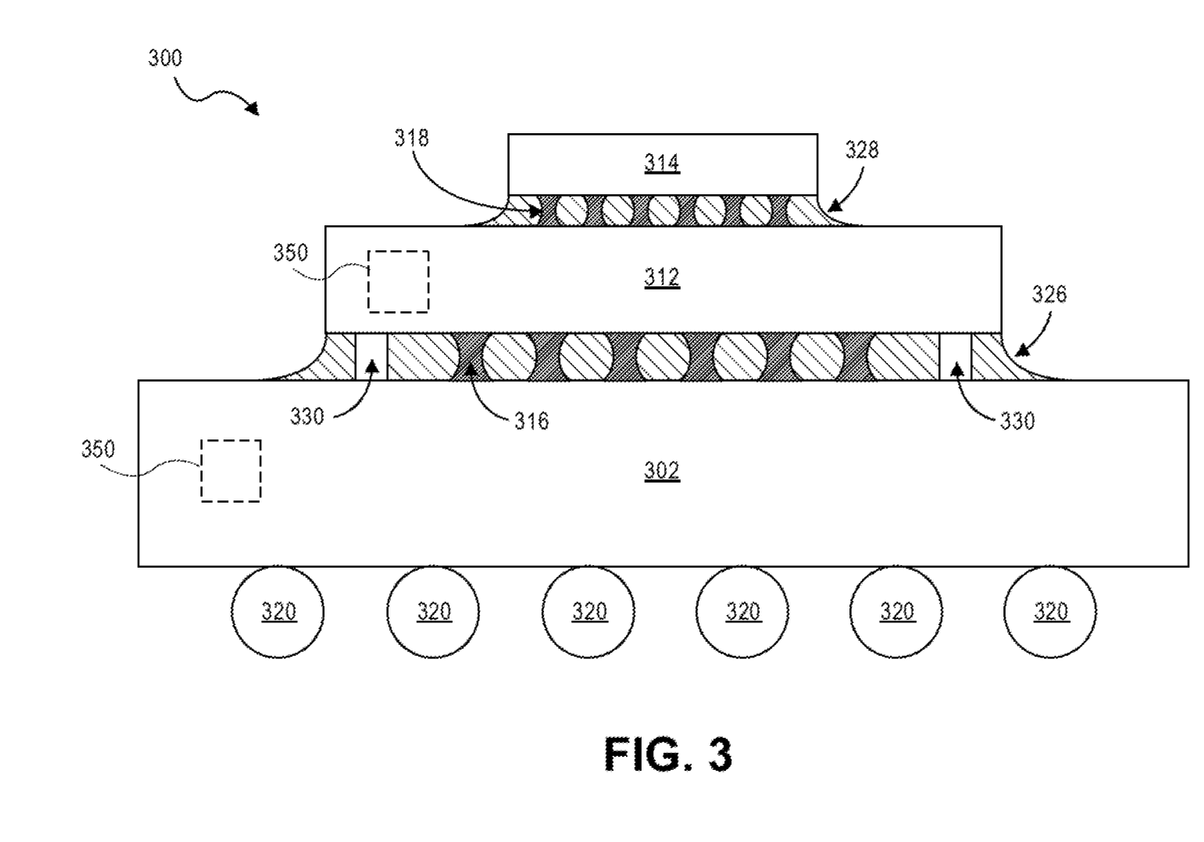
FIG. 3 is an illustration of a cross-sectional view of a semiconductor package with a die, an interposer, and a package substrate that includes a plurality of waveguides, according to one embodiment.

FIG. 3 is an illustration of a cross-sectional view of a semiconductor packaged system 300 including a die 314, a substrate 312, a package substrate 302, and a plurality of waveguides 350, according to one embodiment. FIG. 3 illustrates a semiconductor package 300 including a die 314, a substrate 312 (or an interposer), interconnect structures (e.g., the plurality of bumps disposed below the die 314 and the substrate 312), and the package substrate 302, where the substrate 312 and/or the package substrate 302 may include the waveguides 350 described herein that are embedded in one or more different dielectric layers of the respective substrates 302 and/or 312, according to some embodiments.

For one embodiment, the semiconductor package 300 may implement the substrate 312 and/or the package substrate 302 to include the waveguides 350 (as the fully enclosed and/or the partially enclosed, hollow air-gap waveguide interconnects described herein). In some embodiment, the waveguides 350 of the substrate 312 and/or the package substrate 302 may be substantially similar to the waveguides 101-102 and 201-202 of the semiconductor packages 100 and 200 described above in FIGS. 1-2A-2N. Note that the semiconductor package 300 is not limited to the illustrated semiconductor packaged system, and thus may be designed/formed with fewer, alternate, or additional packaging components and/or with different interconnecting structures.

According to one embodiment, the semiconductor package 300 is merely one example of an embodiment of a semiconductor packaged system. For one embodiment, the semiconductor package 300 may include a ball grid array (BGA) package, a land grid array (LGA) package, and/or a pin grid array (PGA) package. For one embodiment, a die 314 is coupled to a substrate 312 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 314, the substrate 312, and the package substrate 302 may be coupled using anisotropic conductive film (ACF). For one embodiment, the substrate 312 may be, but is not limited to, a silicon interposer and/or a die with through silicon vias (TSVs). For an alternate embodiment, the semiconductor package 300 may omit the interposer/substrate 312.

For some embodiments, the semiconductor package 300 may have the die 314 disposed on the interposer 312, where both the stacked die 314 and interposer 312 are disposed on a package substrate 302. According to some embodiments, the package substrate 302 may include, but is not limited to, a package, a substrate, a PCB, and a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB 302 may also include conductive layers that comprise copper lines/traces, metallic pads, vias, via pads, planes, and/or holes.

For one embodiment, the die 314 may include, but is not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). The die 314 may be formed from a material such as silicon and have circuitry thereon that is to be coupled to the interposer 312. Although some embodiments are not limited in this regard, the package substrate 302 may in turn be coupled to another body, for example, a computer motherboard. One or more connections between the package substrate 302, the interposer 312, and the die 314—e.g., including some or all of bumps 316, 318, and 320—may include one or more interconnect structures and underfill layers 326 and 328. In some embodiments, these interconnect structures (or connections) may variously comprise an alloy of nickel, palladium, and tin (and, in some embodiments, copper).

Connections between the package substrate 302 and another body may be made using any suitable structure, such as the illustrative bumps 320 shown. The package substrate 302 may include a variety of electronic structures formed thereon or therein. The interposer 312 may also include electronic structures formed thereon or therein, which may be used to couple the die 314 to the package substrate 302. For one embodiment, one or more different materials may be used for forming the package substrate 302 and the interposer 312. In certain embodiments, the package substrate 302 is an organic substrate made up of one or more layers of polymer base material, with conducting regions for transmitting signals. In certain embodiments, the interposer 312 is made up of a ceramic base material including metal regions for transmitting signals. Although some embodiments are not limited in this regard, the semiconductor package 300 may include gap control structures 330—e.g., positioned between the package substrate 302 and the interposer 312. Such gap control structures 330 may mitigate a change in the height of the gap between the package substrate 302 and the interposer 312, which otherwise might occur during reflowing while die 314 is attached to interposer 312. Note that the semiconductor package 300 includes an underfill material 328 between the interposer 312 and the die 314, and an underflow material 326 between the package substrate 302 and the interposer 312. For one embodiment, the underfill materials (or layers) 326 and 328 may be one or more polymers that are injected between the layers. For other embodiments, the underfill materials may be molded underfills (MUF).

Note that the semiconductor package 300 may include fewer or additional packaging components based on the desired packaging design.

Figure 4:
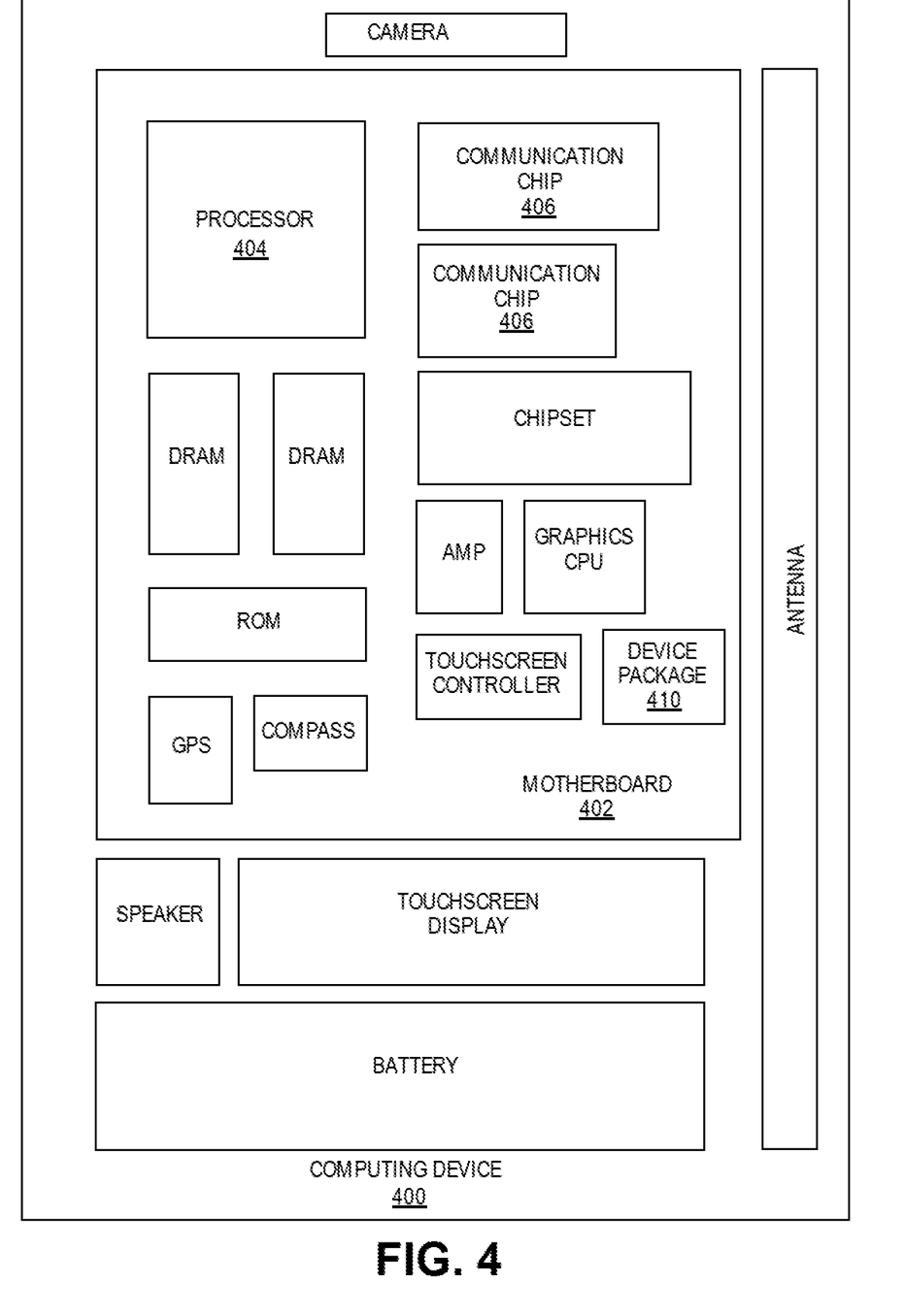
FIG. 4 is an illustration of a schematic block diagram illustrating a computer system that utilizes a device package with a package substrate that includes a plurality of waveguides, according to one embodiment.

FIG. 4 is an illustration of a schematic block diagram illustrating a computer system 400 that utilizes a device package 410 (or a semiconductor package) with a package substrate having a plurality of waveguide interconnects that are disposed in a plurality of dielectric layers, according to one embodiment. FIG. 4 illustrates an example of computing device 400. Computing device 400 houses a motherboard 402. Motherboard 402 may include a number of components, including but not limited to processor 404, device package 410 (or semiconductor package), and at least one communication chip 406. Processor 404 is physically and electrically coupled to motherboard 402. For some embodiments, at least one communication chip 406 is also physically and electrically coupled to motherboard 402. For other embodiments, at least one communication chip 406 is part of processor 404.

Depending on its applications, computing device 400 may include other components that may or may not be physically and electrically coupled to motherboard 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 406 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. Device package 410 may be, but is not limited to, a substrate, a package substrate, and/or a PCB. In one embodiment, device package 410 may be substantially similar to the semiconductor packages 100 and 200 of FIGS. 1-2N described herein. Device package 410 may include a package substrate having the two types of waveguides described herein with triangular structures that are disposed in the dielectric layers and surround the respective cavities and transmission lines (e.g., as illustrated and described above in FIGS. 1-3)—or any other components from the figures described herein.

Note that device package 410 may be a single component/ device, a subset of components, and/or an entire system, as the materials, features, and components may be limited to device package 410 and/or any other component of the computing device 400 that may need multiplexed hollow air-gap waveguides (e.g., the motherboard 402, the processor 404, and/or any other component of the computing device 400 that may need the embodiments of the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 406 also includes an integrated circuit die packaged within the communication chip 406. For some embodiments, the integrated circuit die of the communication chip 406 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a plurality of first waveguides over a package substrate, wherein the plurality of first waveguides include a plurality of first angled conductive layers, a plurality of first transmission lines, and a plurality of first cavities; a first dielectric over the plurality of first waveguides and the package substrate; a plurality of second waveguides over the first dielectric and the plurality of first waveguides, wherein the plurality of second waveguides include a plurality of second angled conductive layers, a plurality of second transmission lines, and a plurality of second cavities; and a second dielectric over the plurality of second waveguides and the first dielectric.

In example 2, the subject matter of example 1 can optionally include that the plurality of first transmission lines are on a top surface of the package substrate, and wherein the plurality of the first angled conductive layers are positioned over the plurality of first transmission lines and the top surface of the package substrate having a first pattern of a plurality of first triangular structures.

In example 3, the subject matter of examples 1-2 can optionally include that the plurality of first triangular structures surround the plurality of first cavities and the plurality of first transmission lines, and wherein the plurality of first cavities include a plurality of first hollow openings that are embedded by the plurality of first angled conductive layers.

In example 4, the subject matter of examples 1-3 can optionally include that the plurality of first transmission lines are a plurality of first conductive cores, wherein the plurality of first conductive cores are positioned at the center of each of the plurality of first triangular structures, and wherein the plurality of first hollow openings include air that isolates the plurality of first conductive cores.

In example 5, the subject matter of examples 1-4 can optionally include that the first dielectric has a thickness that is substantially equal to a thickness of the plurality of first cavities, and wherein the first dielectric has a plurality of first portions that are embedded between the plurality of first triangular structures of the plurality of first waveguides.

In example 6, the subject matter of examples 1-5 can optionally include that the plurality of second transmission lines are on a top surface of the first dielectric, wherein each of the plurality of second transmission lines is disposed over the first dielectric and approximately positioned between two of the plurality of first triangular structures, wherein the plurality of the second angled conductive layers are positioned over the plurality of second transmission lines and the top surface of the first dielectric having a second pattern of a plurality of second triangular structures, and wherein the second pattern of the second waveguides are shaped as a plurality of coaxial interconnects that are enclosed by the plurality of second triangular structures and the plurality of first portions of the first dielectric.

In example 7, the subject matter of examples 1-6 can optionally include that the plurality of second triangular structures surround the plurality of second cavities and the plurality of second transmission lines, and wherein the plurality of second cavities include a plurality of second hollow openings that are embedded by the plurality of second angled conductive layers.

In example 8, the subject matter of examples 1-7 can optionally include that the plurality of second transmission lines are a plurality of second conductive cores, wherein the plurality of second conductive cores are positioned at the center of each of the plurality of second triangular structures, and wherein the plurality of second hollow openings include air that isolates the plurality of second conductive cores.

In example 9, the subject matter of examples 1-8 can optionally include that the second dielectric has a thickness that is substantially equal to a thickness of the plurality of second cavities, wherein the second dielectric is between the plurality of second triangular structures of the plurality of second waveguides, and wherein the second dielectric has a top surface that is substantially coplanar to top surfaces of the plurality of second triangular structures.

Example 10 is a method to form a semiconductor package, comprising: disposing a plurality of first transmission lines and a first seed layer over a package substrate; disposing a first resist layer over the plurality of first transmission lines and the first seed layer; patterning a plurality of first angled openings into the first resist layer; disposing a conductive material into the plurality of first angled openings to form a plurality of first angled conductive layers over the first seed layer; removing the first resist layer and the first seed layer to expose a plurality of first cavities below the plurality of first angled conductive layers; and disposing a first dielectric over the plurality of first angled conductive layers and the package substrate to form a plurality of first waveguides that are over the package substrate, wherein the plurality of first waveguides include the plurality of first angled conductive layers, the plurality of first transmission lines, and the plurality of first cavities.

In example 11, the subject matter of example 10 can optionally include disposing a plurality of second transmission lines and a second seed layer over the first dielectric and the plurality of first waveguides; disposing a second resist layer over the plurality of second transmission lines and the second seed layer; patterning a plurality of second angled openings into the second resist layer; disposing the conductive material into the plurality of second angled openings to form a plurality of second angled conductive layers over the second seed layer; removing the second resist layer and the second seed layer to expose a plurality of second cavities below the plurality of second angled conductive layers; and disposing a second dielectric over the plurality of second angled conductive layers and the first dielectric to form a plurality of second waveguides, wherein the plurality of second waveguides include the plurality of second angled conductive layers, the plurality of second transmission lines, and the plurality of second cavities.

In example 12, the subject matter of examples 10-11 can optionally include that the plurality of first transmission lines are on a top surface of the package substrate, wherein the plurality of the first angled conductive layers are positioned over the plurality of first transmission lines and the top surface of the package substrate having a first pattern of a plurality of first triangular structures, wherein the plurality of first triangular structures surround the plurality of first cavities and the plurality of first transmission lines, and wherein the plurality of first cavities include a plurality of first hollow openings that are embedded by the plurality of first angled conductive layers.

In example 13, the subject matter of examples 10-12 can optionally include that the plurality of first transmission lines are a plurality of first conductive cores, wherein the plurality of first conductive cores are positioned at the center of each of the plurality of first triangular structures, wherein the plurality of first hollow openings include air that isolates the plurality of first conductive cores, wherein the first dielectric has a thickness that is substantially equal to a thickness of the plurality of first cavities, and wherein the first dielectric has a plurality of first portions that are embedded between the plurality of first triangular structures of the plurality of first waveguides.

In example 14, the subject matter of examples 10-13 can optionally include that the plurality of second transmission lines are on a top surface of the first dielectric and positioned between the plurality of first triangular structures, wherein each of the plurality of second transmission lines is disposed over the first dielectric and approximately positioned between two of the plurality of first triangular structures, wherein the plurality of the second angled conductive layers are positioned over the plurality of second transmission lines and the top surface of the first dielectric having a second pattern of a plurality of second triangular structures, and wherein the second pattern of the second waveguides are shaped as a plurality of coaxial interconnects that are enclosed by the plurality of second triangular structures and the plurality of first portions of the first dielectric.

In example 15, the subject matter of examples 10-14 can optionally include that the plurality of second triangular structures surround the plurality of second cavities and the plurality of second transmission lines, and wherein the plurality of second cavities include a plurality of second hollow openings that are embedded by the plurality of second angled conductive layers.

In example 16, the subject matter of examples 10-15 can optionally include that the plurality of second transmission lines are a plurality of second conductive cores, wherein the plurality of second conductive cores are positioned at the center of each of the plurality of second triangular structures, and wherein the plurality of second hollow openings include air that isolates the plurality of second conductive cores.

In example 17, the subject matter of examples 10-16 can optionally include that the second dielectric has a thickness that is substantially equal to a thickness of the plurality of second cavities, wherein the second dielectric is between the plurality of second triangular structures of the plurality of second waveguides, and wherein the second dielectric has a top surface that is substantially coplanar to top surfaces of the plurality of second triangular structures.

Example 18 is a semiconductor package, comprising: an interposer on a package substrate; a die on the interposer; and a plurality of waveguides in or over the package substrate, wherein the plurality of waveguides include a plurality of first waveguides and a plurality of second waveguides, and wherein the package substrate further comprises the plurality of first waveguides include a plurality of first angled conductive layers, a plurality of first transmission lines, and a plurality of first cavities; a first dielectric over the plurality of first waveguides and the package substrate; the plurality of second waveguides over the first dielectric and the plurality of first waveguides, wherein the plurality of second waveguides include a plurality of second angled conductive layers, a plurality of second transmission lines, and a plurality of second cavities; and a second dielectric over the plurality of second waveguides and the first dielectric.

In example 19, the subject matter of example 18 can optionally include that the plurality of first transmission lines are on a top surface of the package substrate, and wherein the plurality of the first angled conductive layers are positioned over the plurality of first transmission lines and the top surface of the package substrate having a first pattern of a plurality of first triangular structures.

In example 20, the subject matter of examples 18-19 can optionally include that the plurality of first triangular structures surround the plurality of first cavities and the plurality of first transmission lines, and wherein the plurality of first cavities include a plurality of first hollow openings that are embedded by the plurality of first angled conductive layers.

In example 21, the subject matter of examples 18-20 can optionally include that the plurality of first transmission lines are a plurality of first conductive cores, wherein the plurality of first conductive cores are positioned at the center of each of the plurality of first triangular structures, and wherein the plurality of first hollow openings include air that isolates the plurality of first conductive cores.

In example 22, the subject matter of examples 18-21 can optionally include that the first dielectric has a thickness that is substantially equal to a thickness of the plurality of first cavities, and wherein the first dielectric has a plurality of first portions that are embedded between the plurality of first triangular structures of the plurality of first waveguides.

In example 23, the subject matter of examples 18-22 can optionally include that the plurality of second transmission lines are on a top surface of the first dielectric and positioned between the plurality of first triangular structures, wherein each of the plurality of second transmission lines is disposed over the first dielectric and approximately positioned between two of the plurality of first triangular structures, wherein the plurality of the second angled conductive layers are positioned over the plurality of second transmission lines and the top surface of the first dielectric having a second pattern of a plurality of second triangular structures, and wherein the second pattern of the second waveguides are shaped as a plurality of coaxial interconnects that are enclosed by the plurality of second triangular structures and the plurality of first portions of the first dielectric.

In example 24, the subject matter of examples 18-23 can optionally include that the plurality of second triangular structures surround the plurality of second cavities and the plurality of second transmission lines, and wherein the plurality of second cavities include a plurality of second hollow openings that are embedded by the plurality of second angled conductive layers.

In example 25, the subject matter of examples 18-24 can optionally include that the plurality of second transmission lines are a plurality of second conductive cores, wherein the plurality of second conductive cores are positioned at the center of each of the plurality of second triangular structures, wherein the plurality of second hollow openings include air that isolates the plurality of second conductive cores, wherein the second dielectric has a thickness that is substantially equal to a thickness of the plurality of second cavities, wherein the second dielectric is between the plurality of second triangular structures of the plurality of second waveguides, and wherein the second dielectric has a top surface that is substantially coplanar to top surfaces of the plurality of second triangular structures.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a plurality of first waveguides over a package substrate, wherein the plurality of first waveguides include a plurality of first angled conductive layers, a plurality of first transmission lines, and a plurality of first cavities, wherein each of the plurality of first transmission lines is in a corresponding one of the plurality of first cavities, and a corresponding one of the first angled conductive layers surrounds the corresponding one of the plurality of first cavities;
   a first dielectric over the plurality of first waveguides and the package substrate;
   a plurality of second waveguides over the first dielectric and the plurality of first waveguides, wherein the plurality of second waveguides include a plurality of second angled conductive layers, a plurality of second transmission lines, and a plurality of second cavities; and
   a second dielectric over the plurality of second waveguides and the first dielectric.

2. The semiconductor package of claim 1, wherein the plurality of first transmission lines are on a top surface of the package substrate, and wherein the plurality of the first angled conductive layers are positioned over the plurality of first transmission lines and the top surface of the package substrate having a first pattern of a plurality of first triangular structures.

3. The semiconductor package of claim 2, wherein the plurality of first triangular structures surround the plurality of first cavities and the plurality of first transmission lines, and wherein the plurality of first cavities include a plurality of first hollow openings that are embedded by the plurality of first angled conductive layers.

4. The semiconductor package of claim 3, wherein the plurality of first transmission lines are a plurality of first conductive cores, wherein the plurality of first conductive cores are positioned at the center of each of the plurality of first triangular structures, and wherein the plurality of first hollow openings include air that isolates the plurality of first conductive cores.

5. The semiconductor package of claim 2, wherein the first dielectric has a thickness that is substantially equal to a thickness of the plurality of first cavities, and wherein the first dielectric has a plurality of first portions that are embedded between the plurality of first triangular structures of the plurality of first waveguides.

6. The semiconductor package of claim 5, wherein the plurality of second transmission lines are on a top surface of the first dielectric, wherein each of the plurality of second transmission lines is disposed over the first dielectric and approximately positioned between two of the plurality of first triangular structures, wherein the plurality of the second angled conductive layers are positioned over the plurality of second transmission lines and the top surface of the first dielectric having a second pattern of a plurality of second triangular structures, and wherein the second pattern of the second waveguides are shaped as a plurality of coaxial interconnects that are enclosed by the plurality of second triangular structures and the plurality of first portions of the first dielectric.

7. The semiconductor package of claim 6, wherein the plurality of second triangular structures surround the plurality of second cavities and the plurality of second transmission lines, and wherein the plurality of second cavities include a plurality of second hollow openings that are embedded by the plurality of second angled conductive layers.

8. The semiconductor package of claim 7, wherein the plurality of second transmission lines are a plurality of second conductive cores, wherein the plurality of second conductive cores are positioned at the center of each of the plurality of second triangular structures, and wherein the plurality of second hollow openings include air that isolates the plurality of second conductive cores.

9. The semiconductor package of claim 6, wherein the second dielectric has a thickness that is substantially equal to a thickness of the plurality of second cavities, wherein the second dielectric is between the plurality of second triangular structures of the plurality of second waveguides, and wherein the second dielectric has a top surface that is substantially coplanar to top surfaces of the plurality of second triangular structures.

10. A semiconductor package, comprising:
    a plurality of first waveguides over a package substrate, wherein the plurality of first waveguides include a plurality of first angled conductive layers, a plurality of first transmission lines, and a plurality of first cavities, wherein the plurality of first transmission lines are on a top surface of the package substrate, and wherein the plurality of the first angled conductive layers are positioned over the plurality of first transmission lines and the top surface of the package substrate having a first pattern of a plurality of first triangular structures;
    a first dielectric over the plurality of first waveguides and the package substrate;
    a plurality of second waveguides over the first dielectric and the plurality of first waveguides, wherein the plurality of second waveguides include a plurality of second angled conductive layers, a plurality of second transmission lines, and a plurality of second cavities; and
    a second dielectric over the plurality of second waveguides and the first dielectric.

11. The semiconductor package of claim 10, wherein the plurality of first triangular structures surround the plurality of first cavities and the plurality of first transmission lines, and wherein the plurality of first cavities include a plurality of first hollow openings that are embedded by the plurality of first angled conductive layers.

12. The semiconductor package of claim 11, wherein the plurality of first transmission lines are a plurality of first conductive cores, wherein the plurality of first conductive cores are positioned at the center of each of the plurality of first triangular structures, and wherein the plurality of first hollow openings include air that isolates the plurality of first conductive cores.

13. The semiconductor package of claim 10, wherein the first dielectric has a thickness that is substantially equal to a thickness of the plurality of first cavities, and wherein the first dielectric has a plurality of first portions that are embedded between the plurality of first triangular structures of the plurality of first waveguides.

14. The semiconductor package of claim 13, wherein the plurality of second transmission lines are on a top surface of the first dielectric, wherein each of the plurality of second transmission lines is disposed over the first dielectric and approximately positioned between two of the plurality of first triangular structures, wherein the plurality of the second angled conductive layers are positioned over the plurality of second transmission lines and the top surface of the first dielectric having a second pattern of a plurality of second triangular structures, and wherein the second pattern of the second waveguides are shaped as a plurality of coaxial interconnects that are enclosed by the plurality of second triangular structures and the plurality of first portions of the first dielectric.

15. The semiconductor package of claim 14, wherein the plurality of second triangular structures surround the plurality of second cavities and the plurality of second transmission lines, and wherein the plurality of second cavities include a plurality of second hollow openings that are embedded by the plurality of second angled conductive layers.

16. The semiconductor package of claim 14, wherein the second dielectric has a thickness that is substantially equal to a thickness of the plurality of second cavities, wherein the second dielectric is between the plurality of second triangular structures of the plurality of second waveguides, and wherein the second dielectric has a top surface that is substantially coplanar to top surfaces of the plurality of second triangular structures.

17. The semiconductor package of claim 15, wherein the plurality of second transmission lines are a plurality of second conductive cores, wherein the plurality of second conductive cores are positioned at the center of each of the plurality of second triangular structures, and wherein the plurality of second hollow openings include air that isolates the plurality of second conductive cores.

\* \* \* \* \*